(12) United States Patent
Dewey et al.

(10) Patent No.: US 11,929,435 B2
(45) Date of Patent: Mar. 12, 2024

(54) FERROELECTRIC GATE STACK FOR BAND-TO-BAND TUNNELING REDUCTION

(71) Applicant: Intel Corporation, Santa Clara, CA (US)

(72) Inventors: Gilbert Dewey, Beaverton, OR (US); Willy Rachmady, Beaverton, OR (US); Jack T. Kavalieros, Portland, OR (US); Cheng-Ying Huang, Portland, OR (US); Matthew V. Metz, Portland, OR (US); Sean T. Ma, Portland, OR (US); Harold Kennel, Portland, OR (US); Tahir Ghani, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 17/899,429

(22) Filed: Aug. 30, 2022

(65) Prior Publication Data

US 2023/0006065 A1    Jan. 5, 2023

Related U.S. Application Data

(62) Division of application No. 16/140,971, filed on Sep. 25, 2018, now Pat. No. 11,469,323.

(51) Int. Cl.
*H01L 29/78* (2006.01)
*H01L 21/28* (2006.01)
(Continued)

(52) U.S. Cl.
CPC .... *H01L 29/78391* (2014.09); *H01L 29/2003* (2013.01); *H01L 29/40111* (2019.08); *H01L 29/42364* (2013.01); *H01L 29/513* (2013.01); *H01L 29/516* (2013.01); *H01L 29/66522* (2013.01); *H01L 29/6684* (2013.01)

(58) Field of Classification Search
CPC ........... H01L 29/78391; H01L 29/2003; H01L 29/516; H01L 29/66522; H01L 29/517; H01L 29/66568; H01L 29/78; H01L 21/28158–28238; H01L 29/51–518; H01L 29/66833–6684; H01L 29/792–7926; H01L 29/40111; H01L 29/42364; H10B 51/00–50
See application file for complete search history.

(56) References Cited

U.S. PATENT DOCUMENTS

| | | | |
|---|---|---|---|
| 2005/0242342 A1* | 11/2005 | Suh ...................... | H10K 10/474 257/40 |
| 2010/0052077 A1* | 3/2010 | Hsu ...................... | H01L 29/513 257/E21.409 |

(Continued)

*Primary Examiner* — Shahed Ahmed
(74) *Attorney, Agent, or Firm* — Schwabe, Williamson & Wyatt, P.C.

(57) ABSTRACT

Techniques are disclosed for an integrated circuit including a ferroelectric gate stack including a ferroelectric layer, an interfacial oxide layer, and a gate electrode. The ferroelectric layer can be voltage activated to switch between two ferroelectric states. Employing such a ferroelectric layer provides a reduction in leakage current in an off-state and provides an increase in charge in an on-state. The interfacial oxide layer can be formed between the ferroelectric layer and the gate electrode. Alternatively, the ferroelectric layer can be formed between the interfacial oxide layer and the gate electrode.

22 Claims, 4 Drawing Sheets

(51) Int. Cl.
*H01L 29/20* (2006.01)
*H01L 29/423* (2006.01)
*H01L 29/51* (2006.01)
*H01L 29/66* (2006.01)

(56) References Cited

U.S. PATENT DOCUMENTS

| | | | |
|---|---|---|---|
| 2010/0109098 A1* | 5/2010 | Lin | H01L 21/3141 |
| | | | 257/E21.294 |
| 2013/0292698 A1* | 11/2013 | Then | H01L 21/30612 |
| | | | 438/270 |
| 2014/0060210 A1* | 3/2014 | Jeon | G01L 1/16 |
| | | | 73/862.68 |
| 2015/0325684 A1* | 11/2015 | Xu | H01L 21/02266 |
| | | | 438/289 |
| 2016/0204207 A1* | 7/2016 | Then | H01L 29/42392 |
| | | | 438/285 |
| 2017/0018604 A1* | 1/2017 | Ahn | H01L 28/40 |
| 2018/0076040 A1* | 3/2018 | Ando | H01L 29/66795 |
| 2018/0166576 A1* | 6/2018 | Wang | H01L 21/28114 |
| 2018/0366472 A1* | 12/2018 | Wu | H01L 27/1203 |
| 2019/0326281 A1* | 10/2019 | Chen | H01L 21/02211 |

\* cited by examiner

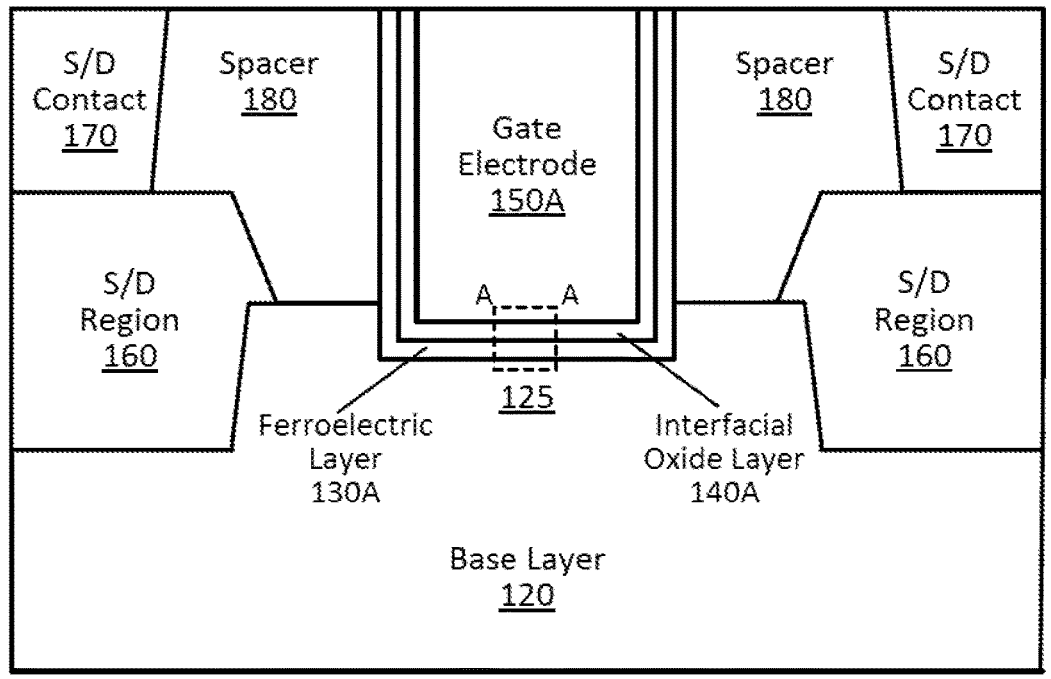
FIG. 4
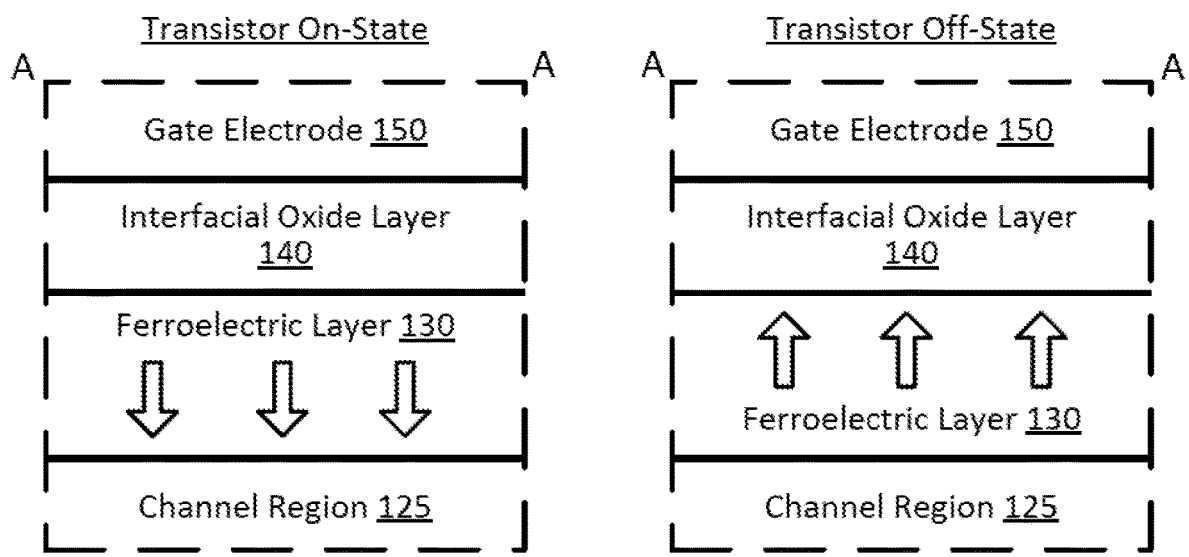
FIG. 5A  FIG. 5B

FERROELECTRIC GATE STACK FOR BAND-TO-BAND TUNNELING REDUCTION

This application is a division of U.S. patent application Ser. No. 16/140,971, filed Sep. 25, 2018, the entire contents of which is hereby incorporated by reference herein.

BACKGROUND

Semiconductor devices are electronic components that exploit the electronic properties of semiconductor materials, such as silicon (Si), germanium (Ge), and silicon germanium (SiGe). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Standard dopant used for Si, Ge, and SiGe includes boron (B) for p-type (acceptor) dopant and phosphorous (P) or arsenic (As) for n-type (donor) dopant. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations includes three different planer regions of the fin (e.g., top and two sides), such a FinFET design is sometimes referred to as a tri-gate transistor. Other types of FinFET configurations are also available, such as so-called double-gate Fin-FETs, in which the conductive channel principally resides only along the two sidewalls of the fin (and not along the top of the fin).

BRIEF DESCRIPTION OF THE DRAWINGS

FIG. 4 illustrates a cross-section of an example ferroelectric-based transistor structure including a ferroelectric layer in the stack, in accordance with another embodiment of the present disclosure. Note that the cross-section is taken along the orthogonal-to-gate direction.

FIGS. 5A and 5B illustrate expanded views of the A-A dashed square portion indicated in the example structure of FIG. 4, in accordance with an embodiment of the present disclosure. FIG. 5A corresponds to the ferroelectric-based transistor gate stack layers in the transistor on-state, while FIG. 5B corresponds to the ferroelectric-based transistor gate stack layers in the transistor off-state.

Figure 1:
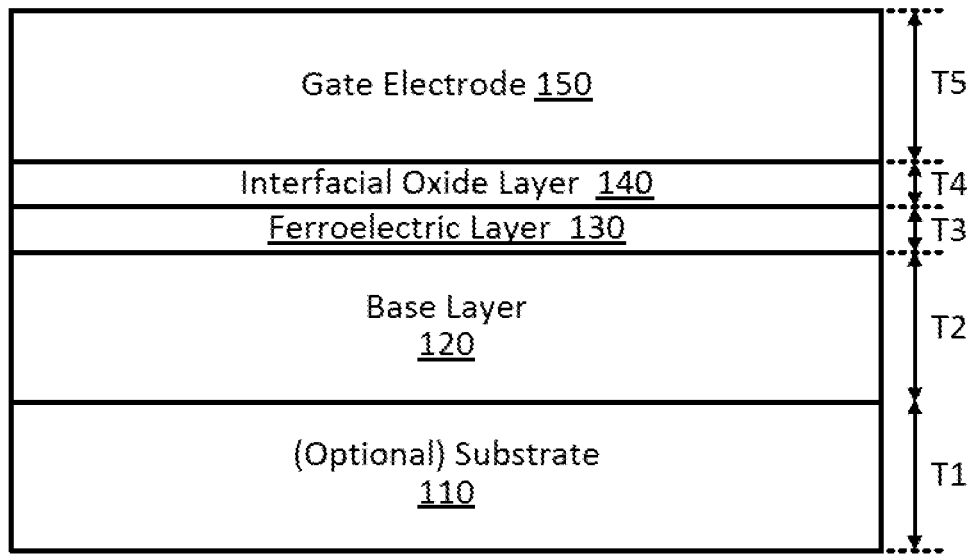
FIG. 1 illustrates a cross-section of an example stack of layers that may be used to form a ferroelectric-based transistor including a ferroelectric layer in the gate stack, in accordance with an embodiment of the present disclosure.

These and other features of the present embodiments will be understood better by reading the following detailed description, taken together with the figures herein described. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

An integrated circuit structure is disclosed having a ferroelectric gate stack including a ferroelectric layer, an interfacial oxide layer, and a gate electrode. In some embodiments, the ferroelectric layer includes a suitable ferroelectric oxide. The ferroelectric layer can be voltage activated to switch between two ferroelectric states. Employing such a ferroelectric layer provides a reduction in leakage current in an off-state and provides an increase in charge in an on-state. In some embodiments, the interfacial oxide layer is between the ferroelectric layer and the gate electrode. In other embodiments, the ferroelectric layer is between the interfacial oxide layer and the gate electrode. In any such cases, the ferroelectric gate stack provides improved performance in the form of reduced off-state leakage and increased on-state charge, as will be appreciated.

General Overview

As previously explained, the channel is a conductive region that connects the source and drain in a FET device, when proper biasing is applied. One factor in the design of semiconductor transistor devices is the mobility of the carrier flowing within the channel. Improved carrier mobility (e.g., how fast the carrier moves through the channel) translates to improved semiconductor performance. However, existing solutions commonly use silicon as the channel material, and carrier mobility provided by silicon channels is finite. For example, typical silicon carrier mobilities are about 200 $cm^2/Vs$. To this end, group III-V semiconductor materials can be used as replacement channel materials in semiconductor transistor devices for certain applications. Group III-V semiconductor materials typically provide high carrier mobilities. For example, as compared to silicon or other group IV semiconductor materials, some group III-V semiconductor materials, such as indium gallium arsenide (InGaAs), indium phosphide (InP), and indium arsenide (InAs), have carrier mobilities as high as 30,000 cm²/Vs. The high carrier mobilities allow group III-V semiconductor material transistor devices to operate much faster than group IV semiconductor material transistor devices at high currents (e.g., when the device is biased to an on-state to allow current flow). Despite the higher carrier mobilities and the potential for faster operating speeds, there are some non-trivial issues associated with group III-V semiconductor material transistor devices. One such issue is leakage current as a result of the small band gaps typically associated with group III-V semiconductor materials. Leakage current, sometimes referred to as band-to-band tunneling (BTBT), can be quite high in small band gap semiconductor material transistor devices. BTBT is the effect when charge carriers flow (or "tunnel") from a channel region to a drain region (or vice versa) of a semiconductor device when the device is biased to an off-state so as to prevent current flow. For example, when a low voltage is applied to a semiconductor gate and a high voltage is applied to a corresponding drain region, a high gradient field is generated between the gate and the drain region. This field can cause charge carriers to tunnel from the valence band of the channel region to the conduction band of the drain region. This BTBT leads to a phenomenon referred to as gate induced drain leakage (GIDL), which is an off-state leakage current. Note that the GIDL can be quite high in small band gap semiconductor material transistor devices. Further note that the GIDL is exponential as a function of the high voltage applied to the drain region. That is, a percentage increase, for example, 20%, 30%, etc., in the high voltage applied to the drain region can result in an exponential increase, for example, 10×, 100×, or even larger, in the GIDL, as compared to a corresponding percentage increase. An undesirable consequence of GIDL is the reduction in gate control, making small band gap semiconductor material transistor devices harder to bias to an off-state (e.g., little or no current flow through the device).

High-k dielectric materials have been proposed for use as an insulator in the gate stack to increase carrier mobility. Use of a high-k gate dielectric allows more carriers to be pulled into the channel in the on-state. Unfortunately, the physical thickness of the high-k gate dielectric needs to be increased to address the off-state leakage current and to avoid reliability concerns. However, increasing the thickness of the high-k dielectric will limit the ability to pull charges into the channel.

Thus, techniques are disclosed herein for integrating a ferroelectric oxide in a gate stack for logic transistor devices and other integrated circuit transistors. Ferroelectric oxides can be characterized as having a built-in-field or polarizable layer that can be reversed by the application of an external electrical field (e.g., voltage activation). For instance, in an off-state (e.g., when the gate voltage is 0 V), the dipoles in the field do not line up and the ferroelectric oxide becomes electrically very thick in that majority of the field drops across the ferroelectric gate oxide and very little of the field drops across the channel. In such a state, the ferroelectric oxide in the gate stack functions as a relatively thick gate oxide in that the field from the gate to the drain is very low. Conversely, in an on-state (e.g., when the gate voltage is 0.65 V or higher), the dipoles in the field line up and the ferroelectric oxide becomes electrically very thin in that majority of the field drops across the channel and very little of the field drops across ferroelectric oxide. In such a state, the ferroelectric oxide in the gate stack functions as a relatively thin gate oxide having a very high effective dielectric constant in that the field from the gate to the drain is very high (e.g., increased charge in the on-state). Thus, for the same physical thickness, the ferroelectric properties allow the ferroelectric oxide layer to electrically function as both a thick oxide in the off-state, and a thin oxide in the on-state. Accordingly, in an off-state, the low field allows the ferroelectric gate oxide to reduce the off-state leakage current commonly associated with small band gap semiconductor material systems. In addition, in an on-state, the increased field across the channel results in an increase in electrical current and a relatively fast turn on. Numerous variations and configurations will be apparent in light of this disclosure.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an integrated circuit or transistor device having a gate stack structure configured as described herein. For example, in some embodiments, such structures may include a ferroelectric layer between a gate dielectric and a metal gate. In other embodiments, such structures may include the gate dielectric between the ferroelectric layer and the metal gate. Further, such a ferroelectric layer may be identified by first identifying a structure including the layer using cross-sectional analysis (e.g., using SEM, TEM, or STEM through a transistor), for example, and then performing analysis for composition of material on the structural layers (e.g., using composition mapping) to identify that the ferroelectric layer exhibits ferroelectric properties and/or includes ferroelectric material, such as one or more of the ferroelectric materials described herein. In some embodiments, the techniques described herein may be detected based on the benefits derived from their use, which include improved on-state charge and/or reduction in off-state leakage as a result of the lower field. Numerous configurations and variations will be apparent in light of this disclosure.

Note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

It is noted that designations such "above" or "below" or "top" or "bottom" or "top side" or "bottom side" are not intended to necessarily implicate a limitation as to orientation of the embodiments described herein. Rather, such terminology is simply used in a relative sense to consistently describe a structure as it exists in any one particular orientation and as illustrated herein.

Architecture and Methodology

Figure 2:
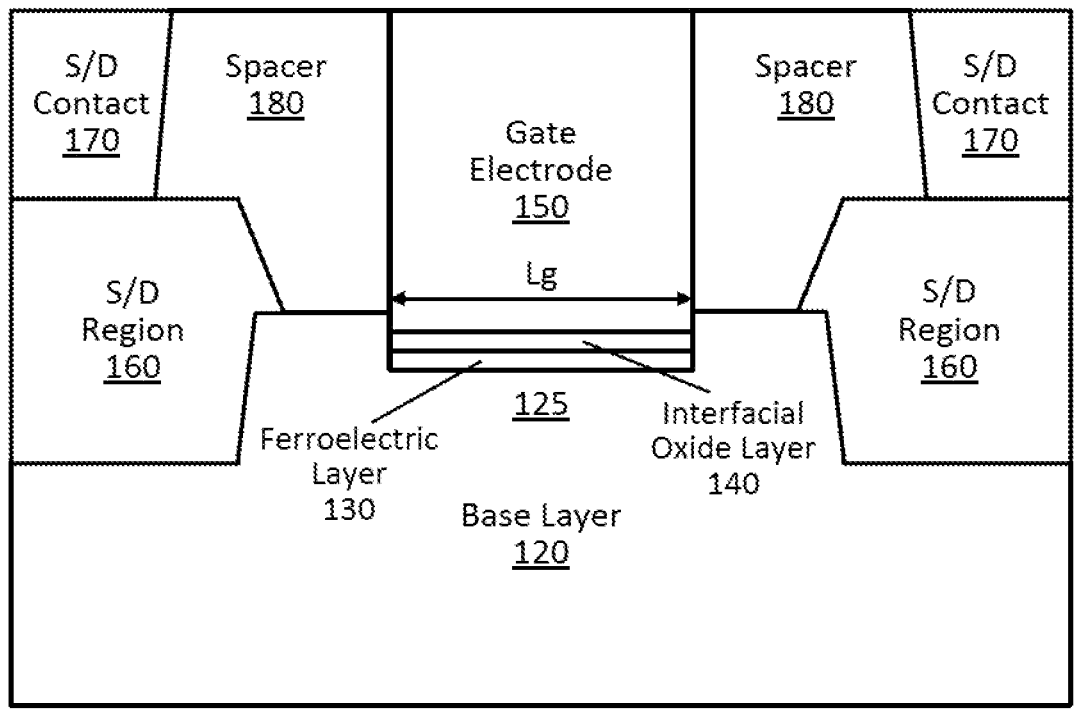
FIG. 2 illustrates a cross-section of an example ferroelectric-based transistor including a ferroelectric layer in the gate stack, in accordance with an embodiment of the present disclosure. Note that the cross-section is taken along the orthogonal-to-gate direction.

FIG. 1 illustrates a cross-section of an example stack of layers that may be used to form a ferroelectric-based transistor including a ferroelectric layer in the gate stack, in accordance with an embodiment of the present disclosure. FIG. 2 illustrates a cross-section of an example ferroelectric-based transistor including a ferroelectric layer in the gate stack, in accordance with an embodiment of the present disclosure. Note that the cross-section is taken along the orthogonal-to-gate direction. As will be apparent based on this disclosure, the example stack of layers shown in FIG. 1 may be used to form the example transistor structure of FIG. 2, in accordance with some embodiments. As will also be apparent in light of this disclosure, the transistor device of FIG. 2 may be used as a logic transistor or a logic field-effect transistor (FET), although any number of transistor applications may benefit.

The layers in the stack shown in FIG. 1 may be formed using any suitable techniques, such as one or more deposition or growth processes. In some example embodiments, for instance, formation of one or more of the layers may be performed using metal-organic chemical vapor deposition (MOCVD), molecular-beam epitaxy (MBE) chemical vapor deposition (CVD), atomic layer deposition (ALD), physical vapor deposition (PVD), spin-on processing, or any other suitable process(es) as will be apparent in light of this disclosure.

The structure of FIG. 2 is primarily depicted and described herein in the context of a planar FET configuration. However, in some embodiments, other transistor configurations can benefit from the techniques described herein. For example, the techniques may be used to form transistors having non-planar configurations, such as finned or finFET configurations (e.g., including a dual-gate or tri-gate configuration) or gate-all-around configurations (e.g., including one or more nanowires or nanoribbons). Further, in some embodiments, the techniques can be used to form numerous different types of transistors, such as MOSFETs, tunnel-FETs (TFETs), high-electron-mobility transistors (HEMTs), or other suitable transistor architectures, depending on the end use or target application. Further yet, in some embodiments, the techniques can be used to form integrated circuits including p-channel and/or n-channel transistor devices, such as p-channel MOSFET (PMOS), n-channel MOSFET (NMOS), p-channel TFET (PTFET), n-channel TFET (NT-FET), p-channel HEMT (PHEMT), and/or n-channel HEMT (NHEMT), to name some examples. Further still, in some embodiments, the techniques may be used to benefit either or both of p-channel and n-channel transistors included in complementary MOS (CMOS) or complementary TFET (CTFET) devices, for example. In some embodiments, the techniques may be used to benefit devices of varying scales, such as transistor devices having critical dimensions in the micrometer range or in the nanometer range (e.g., transistors formed at the 32, 22, 14, 10, 7, or 5 nm process nodes, or beyond).

As shown in FIG. 1, a base layer 120 is formed above an optional substrate 110. As will be apparent based on this disclosure, in this example embodiment, base layer 120 includes a transistor channel region (e.g., a channel region 125 shown in FIG. 2). Substrate 110 is optional because, in some embodiments, base layer 120 may be a bulk wafer, such that the base layer is not formed above or on another material substrate but is instead used as the substrate itself, for example. However, in the example stack of layers shown in FIG. 1, substrate 110 is present and base layer 120 is formed above substrate 110. In some embodiments, substrate 110 (where present) may include: a bulk substrate including group IV material, such as silicon (Si), germanium (Ge), SiGe, or silicon carbide (SiC) and/or group III-V material and/or sapphire and/or any other suitable material (s) depending on the end use or target application; an X on insulator (XOI) structure where X is one of the aforementioned materials (e.g., group IV and/or group III-V and/or sapphire) and the insulator material is an oxide material or dielectric material or some other electrically insulating material; or some other suitable multilayer structure where the top layer includes one of the aforementioned materials (e.g., group IV and/or group III-V and/or sapphire). Note that group IV material as used herein includes at least one group IV element (e.g., carbon, silicon, germanium, tin, lead), such as Si, Ge, SiGe, or SiC to name some examples. Note that group III-V material as used herein includes at least one group III element (e.g., aluminum, gallium, indium, boron, thallium) and at least one group V element (e.g., nitrogen, phosphorus, arsenic, antimony, bismuth), such as gallium nitride (GaN), gallium arsenide (GaAs), indium gallium nitride (InGaN), and indium gallium arsenide (InGaAs), to name some examples. Although substrate 110, in this example embodiment, is shown as having a thickness T1 (the vertical dimension or the stack of layers' main axis dimension) similar to the other features for ease of illustration, in some instances, substrate 110 may be much thicker than the other layers, such as having a thickness T1 in a range of about 50 to 950 microns, for example. In some embodiments, substrate 110 may be used for one or more other integrated circuit (IC) devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various sensors, or any other suitable semiconductor or IC devices, depending on the end use or target application. Accordingly, in some embodiments, the transistor structures described herein may be included in a system-on-chip (SoC) application, as will be apparent in light of this disclosure.

In some embodiments, an optional nucleation layer (not shown) may be present between base layer 120 and substrate 110. For instance, in an example embodiment, where base layer 120 is a III-V material and formed on substrate 110 that includes non-III-V material (e.g., on a Si, Ge, SiGe, SiC, or sapphire substrate), the optional nucleation layer may be formed between the III-V base layer and the substrate to, for example, improve growth conditions and/or prevent the III-V base layer from reacting with the non-III-V substrate material. In such an example embodiment, the optional nucleation layer may include a III-V material, such as AlN or a low temperature GaN layer (e.g., epitaxially grown at a temperature in the range of 700 degrees Celsius to 950 degrees Celsius), for example. In another example embodiment, the optional nucleation layer may include an insulating material in an XOI configuration as previously described, where the insulating material layer is sandwiched (e.g., positioned) between base layer 120 and substrate 110 to, for example, reduce parasitic capacitance to the substrate. For instance, in such an example embodiment, a silicon on insulator (SOI) configuration may employ a silicon substrate and a silicon base layer, with an electrically insulating material layer between the silicon layers, where the insulating layer may include silicon dioxide or sapphire, for example. In some such embodiments, where the optional nucleation layer is an insulating layer, it may be a buried oxide (BOX) layer, for example. In some embodiments, the optional nucleation layer may have a multilayer structure including multiple material layers. In some embodiments, the optional nucleation layer may or may not include grading (e.g., increasing and/or decreasing) the content of one or more materials in at least a portion of the layer. Further, in some such embodiments, the optional nucleation layer (where present) may have any suitable thickness, such as a thickness of about 10 nm to 2 microns (e.g., about 200 nm to 1 micron), or any other suitable thickness, depending on the end use or target application. Note that substrate 110 is not shown in the structure of FIG. 2 for ease of illustration. However, in some embodiments, substrate 110 may be present in the structure of FIG. 2, even though it is not shown.

In some embodiments, base layer 120 may include any suitable material, including group III-V material (e.g., InGaAs, InP, GaAs, Ge, InSb, InAs, GaN, InGaN), and/or any other suitable material, as will be apparent in light of this disclosure. In some embodiments, base layer 120 may have a multilayer structure including multiple material layers. In some embodiments, base layer 120 may or may not include grading (e.g., increasing and/or decreasing) the content of one or more materials in at least a portion of the layer. In some embodiments, base layer 120 may be formed to have a thickness T2 in a range of about 50 nm and 2 microns (e.g., about 200 to 800 nm), or any other suitable thickness, depending on the end use or target application. In embodiments where substrate 110 is not present and base layer 120 is a bulk wafer, then base layer 120 may be substantially thicker, such as greater than 100 microns in thickness, for example.

A ferroelectric layer 130, as is described in more detail herein, allows the off-state leakage current (e.g., BTBT) of the transistor structure of FIG. 2 to be reduced and, in some instances, significantly reduced. Ferroelectric layer 130 also allows the on-state charge of the transistor structure of FIG. 2 to be increased, which results in an increase in electrical current and a relatively fast turn on (e.g., relatively fast threshold switching), for example. In some embodiments, ferroelectric layer 130 may include any suitable ferroelectric material, such as one or more ferroelectric oxides. In some embodiments, ferroelectric layer 130 includes oxygen. In some such embodiments where ferroelectric layer 130 includes oxygen, ferroelectric layer 130 also includes one or more other materials, such as one or more of aluminum, barium, bismuth, hafnium, iron, lead, lithium, niobium, potassium, strontium, titanium, or zirconium. For instance, ferroelectric layer 130 may include aluminum and oxygen (e.g., in the form of hafnium aluminate ($HfAlO_2$)), ferroelectric layer 130 may include barium and oxygen (e.g., in the form of barium titanate ($BaTiO_3$) or barium strontium titanate ($BaSrTiO_3$)), ferroelectric layer 130 may include bizmuth and oxygen (e.g., in the form of bismuth ferrite ($BiFeO_3$)), ferroelectric layer 130 may include hafnium and oxygen (e.g., in the form of hafnium dioxide ($HfO_2$), hafnium aluminate ($HfAlO_2$), or hafnium zirconate ($HfZrO_2$)), ferroelectric layer 130 may include iron and oxygen (e.g., in the form of bismuth ferrite ($BiFeO_3$)), ferroelectric layer 130 may include lead and oxygen (e.g., in the form of lead titanate ($PbTiO_3$)), ferroelectric layer 130 may include lithium and oxygen (e.g., in the form of lithium tantalite ($LiTaO_3$)), ferroelectric layer 130 may include niobium and oxygen (e.g., in the form of potassium niobite ($KNbO_3$)), ferroelectric layer 130 may include potassium and oxygen (e.g., in the form of potassium niobite ($KNbO_3$)), ferroelectric layer 130 may include strontium and oxygen (e.g., in the form of barium strontium titanate ($BaSrTiO_3$)), ferroelectric layer 130 may include titanium and oxygen (e.g., in the form of barium titanate ($BaTiO_3$), lead titanate ($PbTiO_3$), or zirconium titanate ($ZrTiO_2$)), or ferroelectric layer 130 may include zirconium and oxygen (e.g., in the form of zirconium dioxide ($ZrO_2$), hafnium zirconate ($HfZrO_2$), or zirconium titanate ($ZrTiO_2$)). In some embodiments, ferroelectric layer 130 may be deposited using ALD, such as in cases of large scale integration, for example. In some embodiments, ferroelectric layer 130 may have a multilayer structure including multiple material layers. In some embodiments, ferroelectric layer 130 may or may not include grading (e.g., increasing and/or decreasing) the content of one or more materials in at least a portion of the layer. In some embodiments, ferroelectric layer 130 may have a thickness T3 in a range of about 0.5 nm to 10 nm (e.g., about 0.8 nm to 3.8 nm, about 0.8 nm to 3.9 nm, about 0.8 nm to 4 nm, about 0.8 nm to 4.1 nm, about 0.8 nm to 4.2 nm, about 0.9 nm to 3.8 nm, about 0.9 nm to 3.9 nm, about 0.9 nm to 4 nm, about 0.9 nm to 4.1 nm, about 0.9 nm to 4.2 nm, about 1 nm to 3.8 nm, about 1 nm to 3.9 nm, about 1 nm to 4 nm, about 1 nm to 4.1 nm, about 1 nm to 4.2 nm), or any other suitable thickness, as will be apparent in light of this disclosure.

In some embodiments, an interfacial oxide layer 140 may include one or more dielectrics, such as one or more oxides (e.g., silicon dioxide), nitrides (e.g., silicon nitride), high-k dielectrics, low-k dielectrics, and/or any other suitable material as can be understood based on this disclosure. As can be understood based on this disclosure, high-k dielectric material includes material having a dielectric constant, k, greater than that of silicon dioxide (e.g., a k value greater than approximately 3.9). Example high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. Example low-k gate dielectric materials include, for instance, fluorine-doped silicon dioxide, carbon-doped silicon dioxide, porous silicon dioxide, porous carbon-doped silicon dioxide, spin-on organic polymeric dielectrics (e.g., polytetrafluoroethylene, benzocyclobutene, polynorbornenes, polyimide), and spin-on silicon based polymeric dielectrics (e.g., hydrogen silsesquioxane, methylsilsesquioxane), to provide some examples. In some embodiments, an annealing process may be carried out on interfacial oxide layer 140 to improve its quality when, for example, high-k dielectric material is employed.

In some embodiments, interfacial oxide layer 140 includes oxygen. In some such embodiments where interfacial oxide layer 140 includes oxygen, interfacial oxide layer 140 also includes one or more other materials, such as one or more of silicon, aluminum, zirconium, hafnium, lanthanum, or tantalum. For instance, interfacial oxide layer 140 may include silicon and oxygen (e.g., in the form of silicon oxide (SiO), silicon oxynitride ($SiO_xN_y$), or silicon dioxide ($SiO_2$)), aluminum and oxygen (e.g., in the form of aluminum oxide ($Al_2O_3$), aluminum oxynitride (($AlN)_x \cdot (Al_2O_3)_{1-x}$), or aluminum silicate ($xAl_2O_3 \cdot ySiO_2 \cdot zH_2O$)), zirconium and oxygen (e.g., in the form of zirconium oxide ($ZrO_2$), zirconium oxynitride ($ZrO_xN_y$), or zirconium silicate ($ZrSiO_4$)), hafnium and oxygen (e.g., in the form of hafnium oxide ($HfO_2$), hafnium oxynitride ($HfO_xN_y$—C), or hafnium silicate ($HfSiO_4$)), lanthanum and oxygen (e.g., in the form of lanthanum oxide ($La_2O_3$), lanthanum oxynitride ($LaO_xN_y$), or lanthanum silicate ($La_4O_{12}S_{13}$)), or tantalum and oxygen (e.g., in the form of tantalum oxide ($Ta_2O_5$), tantalum oxynitride ($TaO_xN_y$), or tantalum silicate ($TaSiO_x$)). In some embodiments, interfacial oxide layer 140 may have a multilayer structure including multiple material layers. In some embodiments, interfacial oxide layer 140 may or may not include grading (e.g., increasing and/or decreasing) the content of one or more materials in at least a portion of the layer. In some embodiments, interfacial oxide layer 140 may have a thickness T4 in a range of about 0.3 nm to 10 nm (e.g., about 0.4 nm to 2.8 nm, about 0.4 nm to 2.9 nm, about 0.4 nm to 3 nm, about 0.4 nm to 3.1 nm, about 0.4 nm to 3.2 nm, about 0.5 nm to 2.8 nm, about 0.5 nm to 2.9 nm, about 0.5 nm to 3 nm, about 0.5 nm to 3.1 nm, about 0.5 nm to 3.2 nm, about 0.6 nm to 2.8 nm, about 0.6 nm to 2.9 nm, about 0.6 nm to 3 nm, about 0.6 nm to 3.1 nm, about 0.6 nm to 3.2 nm), or any other suitable thickness, depending on the end use or target application.

In some embodiments, a gate electrode 150 may include any suitable material, such as polysilicon, silicon nitride, silicon carbide, and/or various suitable metal materials, such as aluminum (Al), tungsten (W), titanium (Ti), tantalum (Ta), copper (Cu), titanium nitride (TiN), or tantalum nitride (TaN), for example. In some embodiments, gate electrode 150 may have a multilayer structure including multiple material layers. In some embodiments, gate electrode 150 may or may not include grading (e.g., increasing and/or decreasing) the content of one or more materials in at least a portion of the layer. In some embodiments, gate electrode 150 may have a thickness T5 in a range of about 50 nm to 2 microns (e.g., about 200 nm to 800 nm), or any other suitable thickness, depending on the end use or target application. In some embodiments, one or more additional material layers may be formed in the stack of FIG. 1. For instance, in some embodiments, an additional layer may be formed between base layer 120 and ferroelectric layer 130, between ferroelectric layer 130 and interfacial oxide layer 140, and/or between interfacial oxide layer 140 and gate electrode 150 to increase the interface quality between the layers and/or to improve the electrical properties between the layers, for example. Such additional layers may include one or more work-function material layers, for example.

Referring to FIG. 2, in some embodiments, source and drain (S/D) regions 160 may be formed using any suitable techniques, depending on the end use or target application. Any suitable techniques may be used to form S/D regions 160. In some embodiments, S/D regions 160 may include any suitable material and any suitable doping scheme, such as being n-type doped or p-type doped using appropriate techniques and materials based on the S/D material and depending on the end use or target application. For example, in an embodiment where base layer 120 includes Si and the transistor device is configured to be a PMOS device, S/D regions 160 may both include p-type doped Si (e.g., where boron is the p-type dopant). In another example embodiment, where base layer 120 includes Si and the transistor device is configured to be an NMOS device, S/D regions 160 may both include n-type doped Si (e.g., where phosphorus is the n-type dopant). In another example embodiment, where base layer 120 includes III-V material, such as InGaN or GaN, S/D regions 160 may both include n-type doped InN or InGaN (e.g., where Si is the n-type dopant). In some embodiments, S/D regions 160 may have a multi-layer structure including multiple material layers. For instance, in some embodiments, a passivation material may be deposited prior to the deposition of the primary S/D material to assist with the quality of the interface between the S/D region 160 material and base layer 120 material. Further, in some embodiments, a contact-improving material may be formed on the top of S/D regions 160 to assist with making contact to S/D contacts 170 (further described below), for example. In some embodiments, S/D regions 160 may include grading (e.g., increasing and/or decreasing) the content of one or more materials in at least a portion of the regions.

In some embodiments, S/D contacts 170 may be formed using any suitable techniques, depending on the end use or target application. In some embodiments, S/D contacts 170 may include any suitable material, such as a conductive metal or alloy (e.g., aluminum, tungsten, silver, titanium, nickel-platinum, or nickel-aluminum). In some embodiments, S/D contacts 170 may include a resistance reducing metal and a contact plug metal, or just a contact plug, depending on the end use or target application. Example contact resistance reducing metals may include silver, nickel, aluminum, titanium, gold, gold-germanium, nickel-platinum, nickel aluminum, and/or other such resistance reducing metals or alloys. The contact plug metal may include, for instance, aluminum, silver, nickel, platinum, titanium, or tungsten, or alloys thereof, although any suitably conductive contact metal or alloy can be used, depending on the end use or target application. In some embodiments, additional layers may be present in the region of S/D contacts 170, such as adhesion layers (e.g., titanium nitride) and/or liner or barrier layers (e.g., tantalum nitride), if so desired. In some embodiments, metallization of S/D contacts 170 may be carried out, for example, using an alloying, silicidation, or germanidation process (e.g., generally, deposition of contact metal followed by annealing). Numerous S/D configurations, including S/D contact 170 configurations, will be apparent in light of this disclosure.

In some embodiments, spacers 180 may be formed using any suitable techniques, depending on the end use or target application. In some embodiments, spacers 180 (also referred to as sidewall spacers or gate spacers) may include any suitable materials, such as electrical insulators, dielectrics, oxides (e.g., a silicon oxide material), and/or nitrides (e.g., a silicon nitride material). In some embodiments, spacers 180 may be formed prior to forming the gate stack (which includes ferroelectric layer 130, interfacial oxide layer 140, and gate electrode 150, in this example embodiment) or after forming the gate stack. In some embodiments, spacers 180 may be used to help with replacement gate processing, such as a replacement metal gate (RMG) processing, for example. In some embodiments, spacers 180 may have a multi-layer structure including multiple material layers in the spacer regions. For instance, in an example embodiment, multiple vertical layers may be present in the regions of spacers 180, such that there are multiple layers of electrically insulating and/or dielectric material between the gate stack and each of the S/D regions and/or contacts. In addition, the structure shown in FIG. 2 may have isolation materials on the outside sides of the S/D regions, such as shallow trench isolation (STI) material, and interlayer dielectric (ILD) material on the outside sides of S/D contacts 170, for example, where such STI and ILD material may include any suitable material, such as one of the materials listed as being suitable for spacer 180. As can also be seen in the structure of FIG. 2, the gate stack is above channel region 125 and the gate length is indicated as Lg. In some embodiments, the gate length Lg may have a length of about 10 to 50 nm (e.g., less than 25 nm), or have any other suitable length, depending on the end use or target application.

The stack of layers illustrated in FIG. 1 is provided for illustrative purposes and while the stack is used herein to help describe layers that may be present in the transistor structure of FIG. 2, in some embodiments, one or more layers in the stack may not be initially formed when forming the transistor structure of FIG. 2. For example, in some embodiments, a gate first or subtractive gate process flow may be used to form the transistor structure of FIG. 2, where the S/D regions 160 are formed prior to forming the transistor gate stack (which includes ferroelectric layer 130, interfacial oxide layer 140, and gate electrode 150, in this example case). Further, in some embodiments, the process flow may include a gate last and replacement gate process, such as an RMG process, where a dummy gate (e.g., including a dummy gate oxide and dummy gate electrode such as dummy poly-Si) is formed, spacers 180 are formed adjacent to both sides of the dummy gate, and then the dummy gate material is removed and replaced with the gate stack shown in the example structure of FIG. 2. Regardless of whether the transistor fabrication process flow includes a gate-first flow, a gate-last flow, and/or a replacement gate process, any such transistor structure can benefit from including ferroelectric layer 130 and interfacial oxide layer 140 in the gate stack as described herein. Further, additional processing may be performed to complete the formation of one or more transistor devices, such as performing back-end-of line interconnections, for example. Moreover, any suitable techniques may be used in the formation of the transistor structure of FIG. 2, such as using one or more of the deposition techniques described herein (e.g., MOCVD, MBE, CVD, ALD, PVD, spin-on processing) and/or any other suitable material deposition or growth techniques, one or more wet and/or dry etch processes and/or any other suitable material removal techniques, planarization and/or polish techniques, any suitable patterning or lithography techniques, implanting or diffusing or doping techniques, and so forth, depending on the end use or target application. Therefore, the techniques described herein are not intended to be limited to any specific method of transistor fabrication, unless otherwise stated.

Figure 3:
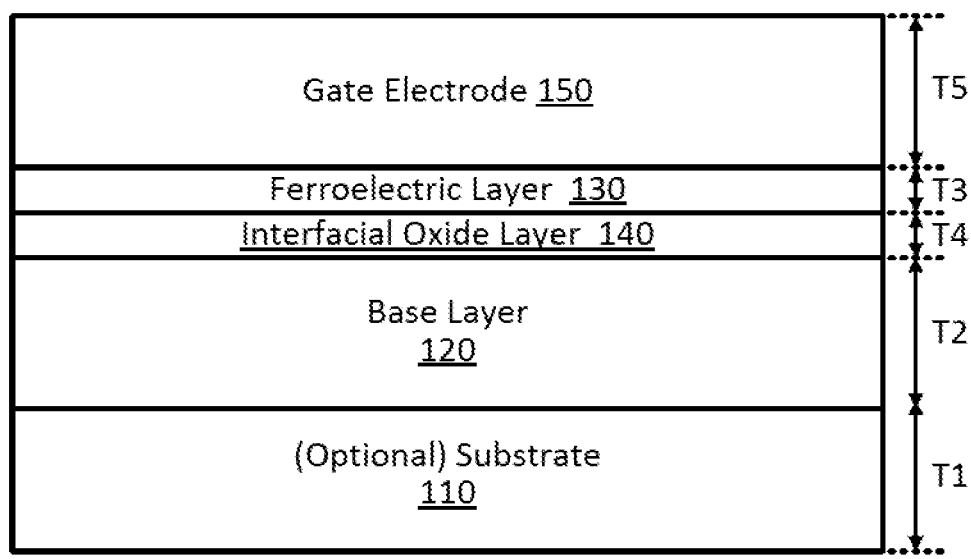
FIG. 3 illustrates a cross-section of another example stack of layers that may be used to form a ferroelectric-based transistor including a ferroelectric layer in the gate stack, in accordance with another embodiment of the present disclosure.

FIG. 3 illustrates a cross-section of an example stack of layers that may be used to form a ferroelectric-based transistor including a ferroelectric layer in the gate stack, in accordance with another embodiment of the present disclosure. The example stack of layers is similar to the example stack of layers illustrated in FIG. 1. The previous relevant discussion with respect to features of FIG. 1 that are similar in FIG. 3 is equally applicable here, including the previous relevant discussion with respect to substrate 110, base layer 120, ferroelectric layer 130, interfacial oxide layer 140, and gate electrode 150. Note that the relative changes to the example stack of FIG. 3 (compared to the example stack of FIG. 1) primarily relate to the positioning or ordering of ferroelectric layer 140 and interfacial oxide layer 140 with the stack of layer. Specifically, in the example stack of layers of FIG. 3, ferroelectric layer 130 is formed above interfacial oxide layer 140 (as compared to the stack of layers of FIG. 1 where ferroelectric layer 130 is formed below interfacial oxide layer 140). That is, ferroelectric layer 130 is between interfacial oxide layer 140 and gate electrode 150. In such embodiments where ferroelectric layer 130 is formed above interfacial oxide layer 140, a preclean may be performed to remove any naturally forming oxide on base layer 120 prior to depositing interfacial oxide layer 140 on base layer 120, for instance. Ferroelectric layer 130 can then be formed on interfacial oxide layer 140, and gate electrode 150 can be formed on ferroelectric layer 130.

FIG. 4 illustrates a cross-section of an example ferroelectric-based transistor structure including a ferroelectric layer in the gate stack, in accordance with another embodiment of the present disclosure. Note that the cross-section is taken along the orthogonal-to-gate direction. The previous relevant discussion with respect to the features of FIG. 2 that are similar in FIG. 4 is equally applicable here, such as the previous relevant discussion with respect to base layer 120, S/D regions 160, S/D contacts 170, spacers 180, and so forth. Note that the relative changes in the example structure of FIG. 4 (compared to the structure of FIG. 2) primarily relate to the gate stack layer (ferroelectric layer 130, interfacial oxide layer 140, and gate electrode 150), as will be understood based on this disclosure. Thus, the gate stack layer in FIG. 4 is indicated with a respective A, B, or C as shown, such as ferroelectric layer 130A, interfacial oxide layer 140A, and gate electrode 150A. Numerous gate stack configurations will be apparent in light of this disclosure.

As can be seen in FIG. 4, both a ferroelectric layer 130A and an interfacial oxide layer 140A are formed on the bottom and sidewalls of the gate trench region (e.g., the region between spacers 180), and the material of the two layers 130A and 140A remains on the sidewalls of that region. In such an example structure, ferroelectric layer 130A and interfacial oxide layer 140A may have been blanket deposited (e.g., via conformal deposition process) after S/D regions 160 and spacers 180 were formed. As a result, in this example embodiment, ferroelectric layer 130A and interfacial oxide layer 140A are between a gate electrode 150A and each of spacers 180, such that gate electrode 150A is no longer directly adjacent to (or in physical contact with) spacers 180. However, in this example embodiment, spacers 180 are still adjacent to both sides of gate electrode 150A, except there is now an intervening bilayer (e.g., ferroelectric layer 130A and interfacial oxide layer 140A), as shown. For embodiments used in logic applications, such as logic transistor application, the gate stack may be the same distance (e.g., equidistant) from both of the S/D regions (e.g., as is the case in FIG. 2); however, the present disclosure is not intended to be so limited. In some embodiments, the gate stack may be separated from each of the S/D regions by at least 5, 10, 15, 20, 25, or 50 nm, or some other suitable minimum distance, depending on the end use or target application.

FIGS. 5A and 5B illustrate expanded views of the A-A dashed square portion indicated in the example structure of FIG. 4, in accordance with an embodiment of the present disclosure. As shown, the A-A dashed square portion includes the gate stack layers of ferroelectric layer 130, interfacial oxide layer 140, and gate electrode 150. Note that the description refers to the three layers generally as 130, 140, and 150 for ease of description, but it will be appreciated that A-A dashed square portion applies equally to layers 130A, 140A, and 150A, respectively, as can be understood based on this disclosure. Also note that the A-A dashed square portion description also applies to a gate state composed of layers 140, 130, and 150, as well as 140A, 130A, and 150A, in such specified ordering (e.g., layering). Specifically, FIG. 5A corresponds to the ferroelectric-based transistor gate stack layers in the transistor on-state, while FIG. 5B corresponds to the ferroelectric-based transistor gate stack layers in the transistor off-state. As can be understood based on this disclosure, when the transistor is in an on-state (shown in FIG. 5A), ferroelectric layer 130 is in a first ferroelectric state (indicated with the arrows pointing downward toward channel region 125), thereby effecting more carriers to be pulled across interfacial layer 140 and ferroelectric layer 130 into channel region 125, which produces increased charge. This in turn provides increased control over the channel. Further, when the transistor is in an off-state (shown in FIG. 5B), ferroelectric layer 130 is in a second ferroelectric state (indicated with the arrows pointing upward toward interfacial oxide layer 140), thereby effecting less field from the gate to the drain (e.g., less field across ferroelectric layer 130 and interfacial oxide layer 140). The lower field results in a reduction in off-state leakage.

Although the techniques and structures described herein with reference to FIGS. 1, 2, 3, and 4 primarily related to a ferroelectric-based transistor having a planar configuration, the techniques can be applied to form transistors of varying configurations. For example, in some embodiments, the techniques may be used to form transistors having non-planar configurations, such as a dual-gate configuration, a tri-gate configuration, or a gate-all-around (GAA) configuration (e.g., including one or more nanowires or nanoribbons). Further, the techniques can be applied to benefit various different transistor types, such as metal-oxide-semiconductor field-effect transistors (MOSFETs), tunnel FETs (TFETs), high electron mobility transistors (HEMTs), to name a few examples. Further still, the techniques can be applied regardless of the transistor doping schemes used. For example, in the case of a MOSFET configuration, the channel region may be doped in a type opposite from the adjacent S/D regions, such as an n-channel MOSFET (NMOS) configuration that includes n-type doped S/D material and p-type doped channel material, or a p-channel MOSFET (PMOS) configuration that includes p-type doped S/D material and n-type doped channel material. In the case of a TFET configuration, the S/D regions may be oppositely typed doped (where one is n-type doped and the other is p-type doped) and the channel material may be minimally doped or undoped/intrinsic. Further note that the techniques can be used to benefit one or both of the n-channel and p-channel transistors included in a complementary device, such as one or both of the NMOS and PMOS transistors included in a complementary MOS (CMOS) device, for example. Accordingly, the techniques described herein are not intended to be limited to any particular transistor configuration, unless otherwise stated. Numerous variations and configurations will be apparent in light of this disclosure.

Example System

Figure 6:
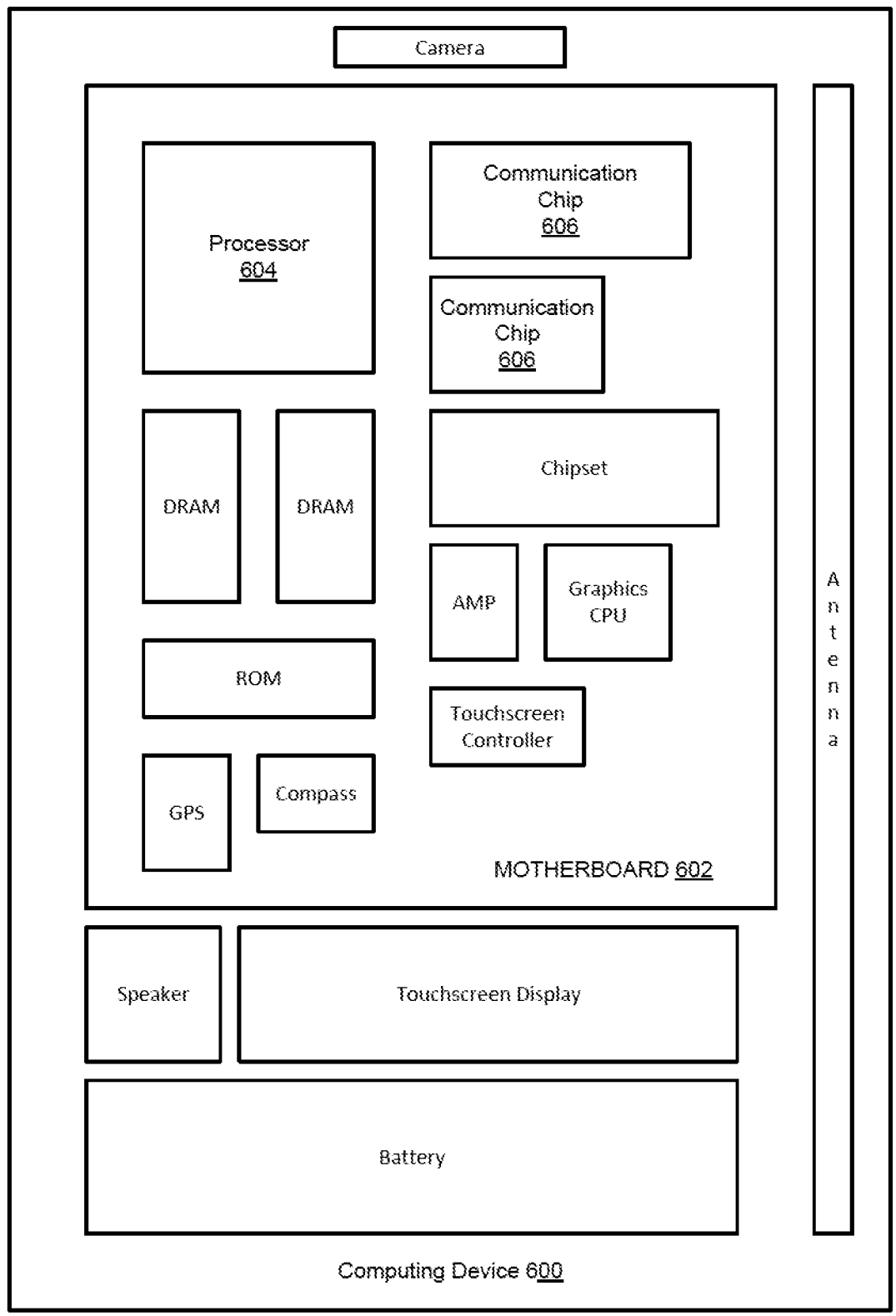
FIG. 6 is an example computing system implemented with one or more of the integrated circuit structures as disclosed herein, in accordance with an embodiment of the present disclosure.

FIG. 6 is an example computing system 600 implemented with one or more of the integrated circuit structures as disclosed herein, in accordance with an embodiment of the present disclosure. As can be seen, computing system 600 houses a motherboard 602. Motherboard 602 may include a number of components, including, but not limited to, a processor 604 and at least one communication chip 606, each of which can be physically and electrically coupled to motherboard 602, or otherwise integrated therein. As will be appreciated, motherboard 602 may be, for example, any printed circuit board, whether a main board, a daughterboard mounted on a main board, or the only board of system 600, etc.

Depending on its applications, computing system 600 may include one or more other components that may or may not be physically and electrically coupled to motherboard 602. These other components may include, but are not limited to, volatile memory (e.g., DRAM), non-volatile memory (e.g., read only memory (ROM)), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 600 may include one or more integrated circuit structures or devices configured in accordance with an example embodiment (e.g., to include one or more semiconductor structures including a bilayer of ferroelectric material and interfacial oxide material, as variously provided herein). In some embodiments, multiple functions can be integrated into one or more chips (e.g., for instance, note that communication chip 606 can be part of or otherwise integrated into processor 604).

Communication chip 606 enables wireless communications for the transfer of data to and from computing system 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 606 may implement any of a number of wireless standards or protocols, including, but not limited to, Wi-Fi (Institute of Electrical and Electronics Engineers (IEEE) 802.11 family), worldwide interoperability for microwave access (WiMAX) (IEEE 802.16 family), IEEE 802.20, long term evolution (LTE), 1x evolution-data optimized (Ev-DO), high speed packet access (HSPA+), high speed downlink packet access (HSDPA+), high speed uplink packet access (HSUPA+), enhanced data rates for GSM evolution (EDGE), global system for mobile communication (GSM), general packet radio service (GPRS), code division multiple access (CDMA), time division multiple access (TDMA), digital enhanced cordless telecommunications (DECT), Bluetooth, derivatives thereof, as well as any other wireless protocols that are designated as 3G, 4G, 5G, and beyond. Computing system 600 may include multiple communication chips 606. For instance, a first communication chip 606 may be dedicated to shorter range wireless communications such as Wi-Fi and Bluetooth, and a second communication chip 606 may be dedicated to longer range wireless communications such as GPS, EDGE, GPRS, CDMA, WiMAX, LTE, Ev-DO, and others. In some embodiments, communication chip 606 may include one or more semiconductor structures including a gate stack architecture comprising a ferroelectric layer and an interfacial oxide layer, as variously described herein.

Processor 604 of computing system 600 includes an integrated circuit die packaged within processor 604. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

Communication chip 606 also may include an integrated circuit die packaged within communication chip 606. In accordance with some such example embodiments, the integrated circuit die of the communication chip includes one or more integrated circuit structures or devices formed using the disclosed techniques, as variously described herein. As will be appreciated in light of this disclosure, note that multi-standard wireless capability may be integrated directly into processor 604 (e.g., where functionality of any chips 606 is integrated into processor 604, rather than having separate communication chips). Further note that processor 604 may be a chip set having such wireless capability. In short, any number of processor 604 and/or communication chips 606 can be used. Likewise, any one chip or chip set can have multiple functions integrated therein.

In various implementations, computing system 600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 includes an integrated circuit including: a gate stack including a ferroelectric layer, an interfacial oxide layer, and a gate electrode, wherein the interfacial oxide layer is between the ferroelectric layer and the gate electrode, and wherein the ferroelectric layer includes ferroelectric material; first and second gate spacers adjacent to respective sides of the gate stack; a base layer below the gate stack and comprising a semiconductor material, wherein the ferroelectric layer is between the base layer and the interfacial oxide layer; and a source region and a drain region to both sides of the gate stack.

Example 2 includes the subject matter of Example 1, wherein the base layer includes group III-V semiconductor material.

Example 3 includes the subject matter of Example 1, wherein the base layer includes gallium and nitrogen.

Example 4 includes the subject matter of any of Examples 1 through 3, wherein the source and drain regions both include indium and nitrogen.

Example 5 includes the subject matter of any of Examples 1 through 4, wherein material of the source and drain regions is n-type doped.

Example 6 includes the subject matter of any of Examples 1 through 5, wherein the ferroelectric material includes at least one of $BaTiO_3$, $PbTiO_3$, $KNbO_3$, $LiTaO_3$, $BiFeO_3$, $BaSrTiO_3$, $ZrO_2$, $HfZrO_2$, $HfAlO_2$, $HfO_2$, and $ZiTrO_2$.

Example 7 includes the subject matter of any of Examples 1 through 6, wherein the ferroelectric layer has a thickness between 1 nm to 4 nm.

Example 8 includes the subject matter of any of Examples 1 through 7, wherein the ferroelectric layer is between the gate electrode and each of the first and second spacers.

Example 9 includes the subject matter of any of Examples 1 through 8, wherein the interfacial oxide layer includes a low-k dielectric material.

Example 10 includes the subject matter of any of Examples 1 through 8, wherein the interfacial oxide layer includes oxygen and at least one of silicon, aluminum, zirconium, hafnium, lanthanum, and tantalum.

Example 11 includes the subject matter of any of Examples 1 through 10, wherein the interfacial oxide layer has a thickness between 0.5 nm to 3 nm.

Example 12 includes the subject matter of any of Examples 1 through 11, wherein the interfacial oxide layer is between the gate electrode and each of the first and second spacers.

Example 13 includes the subject matter of any of Examples 1 through 12, wherein the gate stack, source region, the drain region are part of a planar transistor.

Example 14 includes the subject matter of any of Examples 1 through 12, wherein the gate stack, source region, the drain region are part of a non-planar transistor.

Example 15 includes the subject matter of Example 14, wherein the transistor configuration includes a gate-all-around configuration.

Example 16 includes a transistor including: a gate stack including a ferroelectric layer, an interfacial oxide layer, and a gate electrode, wherein the ferroelectric layer is above the interfacial oxide layer and below the gate electrode, and wherein the ferroelectric layer includes ferroelectric material; first and second spacers adjacent to respective sides of the gate stack; a base layer below the gate stack, wherein the ferroelectric layer is between the base layer and the interfacial oxide layer; and a source region and a drain region to respective sides of the gate stack.

Example 17 includes the subject matter of Example 16, wherein the base layer includes group III-V semiconductor material.

Example 18 includes the subject matter of Example 16, wherein the base layer includes gallium and nitrogen.

Example 19 includes the subject matter of any of Examples 16 through 18, wherein the source and drain regions both include indium and nitrogen.

Example 20 includes the subject matter of any of Examples 16 through 19, wherein material of the source and drain regions is n-type doped.

Example 21 includes the subject matter of any of Examples 16 through 20, wherein the ferroelectric material includes at least one of $BaTiO_3$, $PbTiO_3$, $KNbO_3$, $LiTaO_3$, $BiFeO_3$, $BaSrTiO_3$, $ZrO_2$, $HfZrO_2$, $HfAlO_2$, $HfO_2$, and $ZiTrO_2$.

Example 22 includes the subject matter of any of Examples 16 through 21, wherein the ferroelectric layer has a thickness between 1 nm to 4 nm.

Example 23 includes the subject matter of any of Examples 16 through 22, wherein the ferroelectric layer is between the gate electrode and each of the first and second spacers.

Example 24 includes the subject matter of any of Examples 16 through 23, wherein the interfacial oxide layer includes a low-k dielectric material.

Example 25 includes the subject matter of any of Examples 16 through 23, wherein the interfacial oxide layer includes oxygen and at least one of silicon, aluminum, zirconium, hafnium, lanthanum, and tantalum.

Example 26 includes the subject matter of any of Examples 16 through 25, wherein the interfacial oxide layer has a thickness between 0.5 nm to 3 nm.

Example 27 includes the subject matter of any of Examples 16 through 26, wherein the interfacial oxide layer is between the gate electrode and each of the first and second spacers.

Example 28 includes the subject matter of any of Examples 16 through 27, wherein the gate stack, source region, the drain region are part of a planar transistor.

Example 29 includes the subject matter of any of Examples 16 through 27, wherein the gate stack, source region, the drain region are part of a non-planar transistor.

Example 30 includes the subject matter of Example 29, wherein the transistor configuration includes a gate-all-around configuration.

Example 31 includes a method for forming an integrated circuit structure, the method including: forming a ferroelectric layer above a base layer, the ferroelectric layer including ferroelectric material; forming an interfacial oxide layer above the ferroelectric layer, wherein the ferroelectric layer is between the base layer and the interfacial oxide layer; and forming a gate electrode above the interfacial oxide layer, wherein the interfacial oxide layer is between the ferroelectric layer and the gate electrode, further wherein the ferroelectric layer, interfacial oxide layer, and the gate electrode comprise a gate stack.

Example 32 includes the subject matter of Example 31, further including: forming spacers adjacent to both sides of the gate stack; and forming a source region and a drain region to respective sides of the gate stack.

Example 33 includes the subject matter of any of Examples 31 and 32, wherein forming the ferroelectric layer includes depositing the ferroelectric material using an atomic layer deposition (ALD) process.

Example 34 includes the subject matter of any of Examples 31 and 33, wherein forming the interfacial oxide layer is by atomic layer deposition (ALD).

Example 35 includes the subject matter of any of Examples 31 through 34, wherein the base layer includes group III-V semiconductor material.

Example 36 includes the subject matter of any of Examples 31 through 34, wherein the base layer includes gallium and nitrogen.

Example 37 includes the subject matter of any of Examples 32 through 36, wherein the source and drain regions both include indium and nitrogen.

Example 38 includes the subject matter of any of Examples 32 through 37, wherein material of the source and drain regions is n-type doped.

Example 39 includes the subject matter of any of Examples 32 through 38, wherein the ferroelectric material includes at least one of $BaTiO_3$, $PbTiO_3$, $KNbO_3$, $LiTaO_3$, $BiFeO_3$, $BaSrTiO_3$, $ZrO_2$, $HfZrO_2$, $HfAlO_2$, $HfO_2$, and $ZiTrO_2$.

Example 40 includes the subject matter of any of Examples 32 through 39, wherein the ferroelectric layer has a thickness between 1 nm to 4 nm.

Example 41 includes the subject matter of any of Examples 32 through 40, wherein the ferroelectric layer is between the gate electrode and each of the first and second spacers.

Example 42 includes the subject matter of any of Examples 32 through 41, wherein the interfacial oxide layer includes a low-k dielectric material.

Example 43 includes the subject matter of any of Examples 32 through 41, wherein the interfacial oxide layer includes oxygen and at least one of silicon, aluminum, zirconium, hafnium, lanthanum, and tantalum.

Example 44 includes the subject matter of any of Examples 32 through 43, wherein the interfacial oxide layer has a thickness between 0.5 nm to 3 nm.

Example 45 includes the subject matter of any of Examples 32 through 44, wherein the interfacial oxide layer is between the gate electrode and each of the first and second spacers.

Example 46 includes the subject matter of any of Examples 32 through 45, wherein the gate stack, source region, the drain region are part of a planar transistor.

Example 47 includes the subject matter of any of Examples 32 through 45, wherein the gate stack, source region, the drain region are part of a non-planar transistor.

Example 48 includes the subject matter of Example 47, wherein the transistor configuration includes a gate-all-around configuration.

All examples and conditional language recited in the present disclosure are intended for pedagogical objects to aid the reader in understanding the present disclosure and the concepts contributed by the inventor to furthering the art, and are to be construed as being without limitation to such specifically recited examples and conditions. Although embodiments of the present disclosure have been described in detail, various changes, substitutions, and alterations could be made hereto without departing from the spirit and scope of the present disclosure. Accordingly, it is intended that the scope of the present disclosure be limited not by this detailed description, but rather by the claims appended hereto.

What is claimed is:

1. An integrated circuit structure, comprising:
a gate stack including a ferroelectric layer, an interfacial oxide layer, and a gate electrode, the gate stack having a first side and a second side opposite the first side, wherein the ferroelectric layer includes ferroelectric material;
a first spacer adjacent to the first side of the gate stack;
a second spacer adjacent to the second side of the gate stack; and
a base layer below the gate stack, the base layer comprising a Group III-V semiconductor material, wherein the ferroelectric layer is between the base layer and the interfacial oxide layer.

2. The integrated circuit structure of claim 1, further comprising:
a first source or drain region adjacent to the first side of the gate stack; and
a second source or drain region adjacent to the second side of the gate stack.

3. The integrated circuit structure of claim 1, wherein the ferroelectric material comprises Ba, Ti and O.

4. The integrated circuit structure of claim 1, wherein the ferroelectric material comprises Pb, Ti and O.

5. The integrated circuit structure of claim 1, wherein the ferroelectric material comprises K, Nb and O.

6. The integrated circuit structure of claim 1, wherein the ferroelectric material comprises Li, Ta and O.

7. The integrated circuit structure of claim 1, wherein the ferroelectric material comprises Bi, Fe and O.

8. The integrated circuit structure of claim 1, wherein the ferroelectric material comprises Ba, Sr, Ti and O.

9. The integrated circuit structure of claim 1, wherein the ferroelectric material comprises Zr and O.

10. The integrated circuit structure of claim 1, wherein the ferroelectric material comprises Hf, Zr and O.

11. The integrated circuit structure of claim 1, wherein the ferroelectric material comprises Hf, Al and O.

12. The integrated circuit structure of claim 1, wherein the ferroelectric material comprises Zr, Ti and O.

13. The integrated circuit structure of claim 1, wherein the ferroelectric layer has a thickness between 1 nm to 4 nm.

14. The integrated circuit structure of claim 1, wherein the ferroelectric layer is between the gate electrode and the first spacer, and between the gate electrode and the second spacer.

15. The integrated circuit structure of claim 1, wherein the interfacial oxide layer comprises a low-k dielectric material.

16. The integrated circuit structure of claim 1, wherein the interfacial oxide layer includes oxygen and at least one of aluminum, zirconium, hafnium, lanthanum, and tantalum.

17. The integrated circuit structure of claim 1, wherein the interfacial oxide layer has a thickness between 0.5 nm to 3 nm.

18. A computing device, comprising:
a board; and
a component coupled to the board, the component including an integrated circuit structure, the integrated circuit structure comprising:

a gate stack including a ferroelectric layer, an interfacial oxide layer, and a gate electrode, the gate stack having a first side and a second side opposite the first side, wherein the ferroelectric layer includes ferroelectric material;

a first spacer adjacent to the first side of the gate stack;

a second spacer adjacent to the second side of the gate stack; and a base layer below the gate stack, the base layer comprising a Group III-V semiconductor material, wherein the ferroelectric layer is between the base layer and the interfacial oxide layer.

19. The computing device of claim 18, further comprising:

a memory coupled to the board.

20. The computing device of claim 18, further comprising:

a communication chip coupled to the board.

21. The computing device of claim 18, further comprising:

a camera coupled to the board.

22. The computing device of claim 18, wherein the component is a packaged integrated circuit die.

* * * * *